(12) United States Patent
Jayaraman et al.

(10) Patent No.: US 6,620,512 B2
(45) Date of Patent: Sep. 16, 2003

(54) ANHYDRIDE POLYMERS FOR USE AS CURING AGENTS IN EPOXY RESIN-BASED UNDERFILL MATERIAL

(75) Inventors: Saikumar Jayaraman, Chandler, AZ (US); Rahul Manepalli, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/028,393

(22) Filed: Dec. 21, 2001

(65) Prior Publication Data

US 2003/0118835 A1 Jun. 26, 2003

(51) Int. Cl.⁷ ................................................ B32B 27/38
(52) U.S. Cl. ........................ 428/414; 525/408; 525/449
(58) Field of Search ......................... 428/414; 525/408, 525/449

(56) References Cited

U.S. PATENT DOCUMENTS 6,037,096 A * 3/2000 Fletcher et al. ............. 430/256

* cited by examiner

Primary Examiner—Robert Dawson
Assistant Examiner—Christopher Keehan
(74) Attorney, Agent, or Firm—Kenyon & Kenyon

(57) ABSTRACT

An underfill material is presented that may be used between an electrical component and a substrate. The underfill material may be a cured epoxy resin composition comprising a liquid or semisolid epoxy resin and a polyfunctional anhydride polymer and/or oligomer curing agent. The use of anhydride polymers and/or oligomers decrease the volatilization of the composition, thereby reducing the porosity of the underfill material. By changing substituents of the anhydride polymer and/or oligomer, the underfill material may be designed to modify viscosity, decrease moisture adsorption, volatilization and modulus, improve mechanical properties, and enhance adhesion.

18 Claims, No Drawings

ANHYDRIDE POLYMERS FOR USE AS CURING AGENTS IN EPOXY RESIN-BASED UNDERFILL MATERIAL

BACKGROUND OF THE INVENTION

The present invention relates to a connection between an electrical component and a substrate. More particularly, the present invention relates to controlling the coefficient of thermal expansion for an underfill between a chip and a substrate (e.g., in flip chip mounting).

Microelectronic devices contain millions of electric circuit components, including transistors assembled in integrated circuit chips, resistors, and capacitors. These electronic components are interconnected to form the circuits, and are eventually connected to and supported on a substrate. The connections are made between electrical terminations on the electronic component and corresponding electrical terminations on the substrate. One method for making these connections includes a flip-chip mounting technique. Flip chips are made by positioning the silicon die ("the chip") with the active side ("the face") down on the substrate. Bond pads on the face of the chip are connected by solder bumps or other interconnects to the substrate. During reflow, the solder bumps complete the electrical connections from the active circuitry of the die to the substrate.

During subsequent manufacturing steps, an electronic assembly is subjected to cycles of elevated and lowered temperatures. Because there is a significant difference in the coefficient of thermal expansion (CTE) for the chip, the interconnect material, and the substrate, this thermal cycling can stress the components of the assembly and cause failure at the interconnect points, thereby destroying the functionality of the circuit. To help prevent such failure, the space between the chip and the substrate is underfilled with a dielectric organic material. Once cured, the underfill acts as a buffer between the chip and the substrate and functions to distribute the CTE-induced stress over the entire surface, thereby greatly increasing the life of the finished package. Underfill material also protects the interconnects from moisture and other forms of contamination, and thus, overmolding the back of the chip with epoxy is unnecessary.

The CTE of the underfill material is critical to the reliability of the device because the underfill material compensates for the difference in CTE between the substrate and the chip. In order to reduce solder joint fatigue and extend solder joint life, the CTE of the underfill material should be in the range of about 20 to 40 ppm/° C. at temperatures below its glass transition temperature ($T_g$).

Underfilling may occur after the reflow of the metallic or polymeric interconnect, or it may occur simultaneously with the reflow. If underfilling occurs after reflow of the interconnect, a predetermined amount of the underfill material may be dispensed at one or more sides of the gap between the chip and the substrate. The material will flow by capillary action into the gap, thereby contacting the solder bumps. Some of the defects that can originate during the flow of fluid underfill include delaminations, where the underfill fails to wet and adhere to a surface, and voids, where contamination causes local variations in the speed of flow and causes bubbles to be trapped. Reducing the viscosity of underfill material, however, enables the material to flow more easily into the small gaps between the silicon die and the substrate. The underfill material is subsequently cured to reach its optimized final properties.

If underfilling occurs simultaneously with reflow of the solder or polymeric interconnects, the underfill material first is applied to either the substrate or the chip. Then terminals on the chip and substrate are aligned and contacted and the assembly is heated to reflow the metallic or polymeric interconnect material. During this heating process, curing of the underfill material occurs simultaneously with reflow of the metallic or polymeric interconnect material.

DETAILED DESCRIPTION

In general an underfill material, when cured, is a composite material made up of cross-linked resin. Generally, cross-linking is the attachment of two polymer chains by bridges of an element, a molecular group, or a compound, and in general will occur upon heating. Polymers can be prepared at a variety of cross-link density—from tacky, elastomeric to tough, glassy—by the judicious choice and amount of mono- or polyfunctional compounds, resins, and crosslinking agents. The greater proportion of polyfunctional compounds reacted, the greater the cross-link density. If thermoplastic properties are desired, underfill material may be prepared from different compounds to limit the cross-link density. The cross-link density may also be controlled to give a wide range of $T_g$ in the cured underfill in order to withstand subsequent processing and operation temperatures.

Presently, the anhydrides that are used in underfill material are small molecules that have a tendency to volatize during the curing process. Such volatilization leads to porosity during underfill cure, which leads to system failure (e.g., delamination, voids, and moisture penetration). Further, the presently-used anhydrides typically only perform one function, i.e. cross-linking.

An embodiment of the present invention relates to a curable liquid or semisolid underfill material composition comprising resin such as epoxy resin and silica particles and curing agents such as polyfunctional anhydride polymers and oligomers. The use of low molecular weight anhydride polymers and/or oligomers facilitates the cure process by decreasing the volatilization of the composition, and thereby reducing porosity in the cured underfill materials. Further, using anhydride oligomers and/or polymers in the underfill material creates a unique opportunity to design various oligomers and/or polymers that may react with the epoxy matrix, thereby crosslinking the matrix, and may also provide a structure that may be designed, by substituting different R groups, to modify viscosity, decrease moisture absorption, volatilization and modulus, improve mechanical properties, and/or enhance adhesion. The underfill material may also optionally include catalysts for promoting cross-linking and to control cure time, elastomers for toughening, and/or coupling agents, fillers, fluxing agents, and other additives for flow modification and adhesion. The underfill material may also have a higher $T_g$, thereby resulting in robust material for 260° C. reflow conditions.

The underfill material includes resin, which may be present in an amount of from about 25 to about 100 weight percent based on the organic components present. Suitable resins include epoxy resin such as cycloaliphatic epoxy resins, bisphenol-A type epoxy resins, bisphenol-F type epoxy resins, novolac epoxy resins, biphenyl type epoxy resins, naphthalene type epoxy resins, dicyclopentadiene-phenol type epoxy resins, and mixtures thereof.

The curing agents comprise polyfunctional, low molecular weight anhydride polymers and/or oligomers. In accordance with an embodiment of this invention, the curing agents may include these polymers and/or oligomers in combination with other compounds. The polymers and/or oligomers may be present in the curable underfill material composition in an amount of from about 5 to about 25 weight percent based on total weight of the resin and catalysts. Preferred curing agents include olefin/maleic anhydride copolymers, such as, styrene/maleic anhydride, cyclohexane/maleic anhydride, norbornene/maleic anhydride copolymers. By way of example, the following chemical schematic shows a low-cost, low molecular weight poylmeric cross-linker that may be used in an underfill composition:

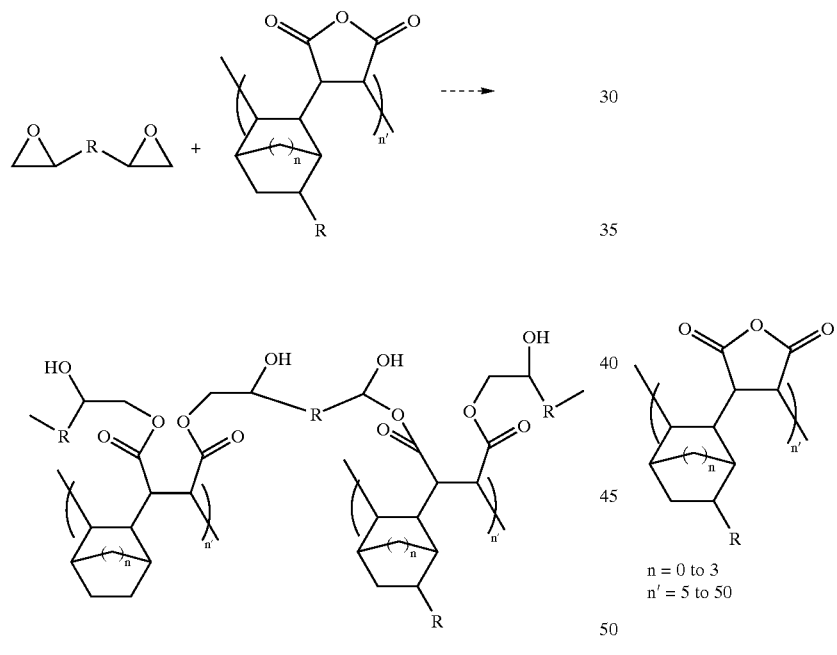

where n is 0 to 3, n' is 5 to 50, and R is selected from the group consisting of alkyl, aryl, substituted aryls, esters, ethers, lactones, anhydrides, alcohols, nitriles, epoxy, and mixtures thereof.

The underfill material composition may include a catalyst, thereby effecting the desired behavior of the formulation. For instance, in addition to controlling the rate of the reaction, catalysts may be used to promote cross-linking and/or to control the curing time of the resin. Suitable catalysts include imidazoles, phosphines, dicyanamide, and substituted dicyamide compounds.

The anhydride polymers and/or oligomers may contain different R groups, which may decrease moisture absorption, volatilization and modulus, may improve mechanical properties, and/or may enhance adhesion. The R group may be nitrites, acids, and/or alcohols. By way of example, the following structural schematics show variations of polymeric anhydride cross-linkers.

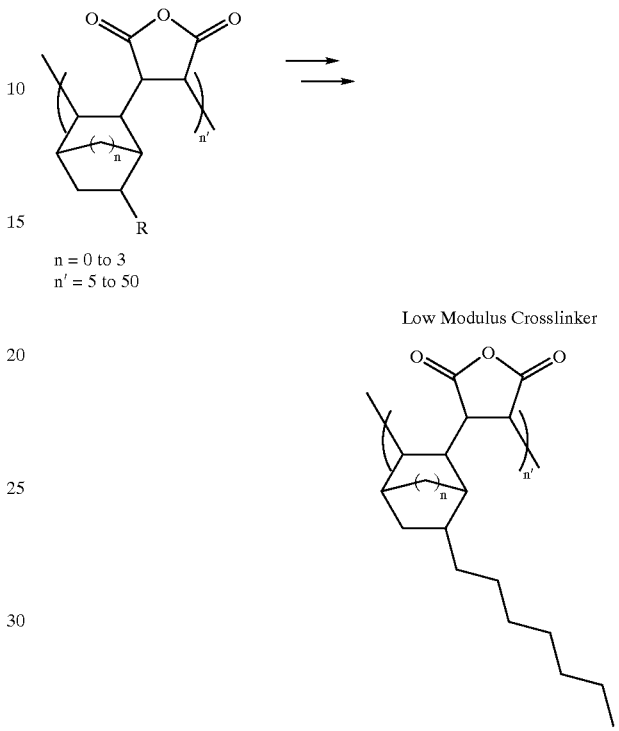

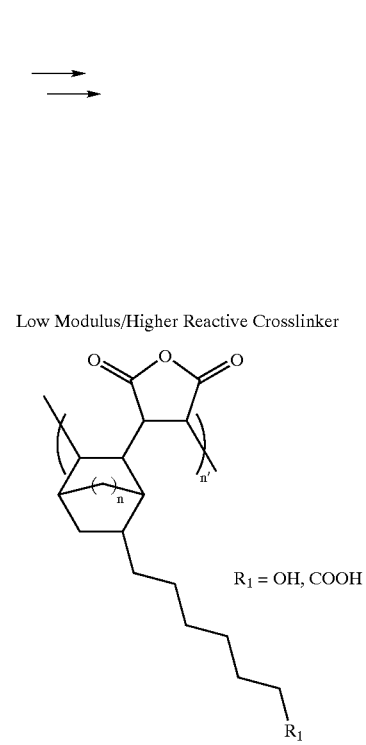

Scheme 4

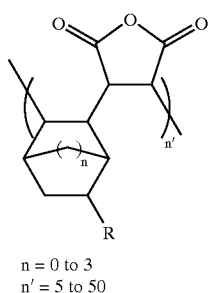

n = 0 to 3
n' = 5 to 50

Low Modulus/Higher Adhesion Crosslinker

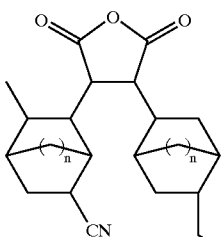

Scheme 5

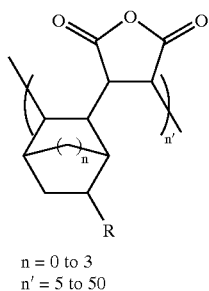

n = 0 to 3
n' = 5 to 50

Pendant Anhydride Crosslinker

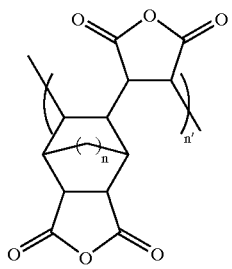

Scheme 6

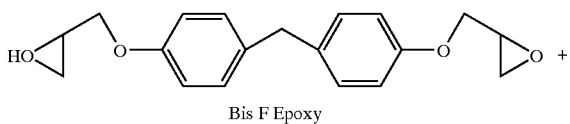

Bis F Epoxy

-continued

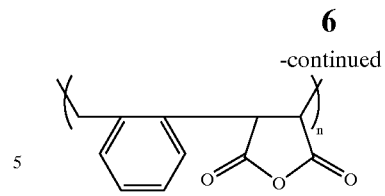

Styrene/Maleic Anhydride
n = 1 to 5

Preferably, the underfill provides strength to the composite polymer and to the resin bonds with the chip and substrate. Also, the underfill material may help to mechanically interlock the chip to the substrate, so it may be desirable for the underfill to exhibit good adhesion to both the die and the substrate. In order to improve the adhesion property of the underfill, coupling agents are widely used. Examples of suitable coupling agents include silanes, titanates, zirconates, aluminates, silicate esters, metal acrylates or methacrylates, compounds containing a chelating ligand (e.g., phosphine, mercaptan, acetoacetate), and/or mixtures thereof. Certain coupling agents, such as titanate and zirconate, may also catalyze the curing reaction of the epoxy underfill, thereby lowering the onset temperatures of curing and increasing the viscosity of the underfill material during storage at low temperatures. The kinds and amounts of coupling agents that may be used are known to those skilled in the art.

The underfill composition may also include a filler material, which is used to adjust the CTE to more closely mirror that of the interconnect. Suitable fillers include silica, graphite, aluminum nitride, silicon nitride, silicon carbide, boron nitride, diamond dust, and clays. Typically, the fillers may be present in an amount of about 20 to about 80 weight percent of the total underfill composition. Further, using well-known techniques, the fillers may be treated to make the filler hydrophobic by silylating agents and/or agents reactive to the adhesive matrix, such as by using coupling agents.

The underfill material may also contain compounds that increase flexibility and toughness in the resultant cured composition. Such compounds may be any thermoset or thermoplastic material having a $T_g$ of 50° C. or less. Suitable compounds include polyacrylates, polymerized THF (tetrahydrofuran), carboxy-terminated butyronitrile rubber, and polypropylene glycol. When present, these compounds may be in an amount of from about 10 to about 20 weight percent of the epoxy resin.

Siloxanes may also be added to the underfill material compositions to provide elastomeric properties. Suitable elastomers include methacryloxypropyl-terminated polydimethyl siloxanes, and aminopropyl-terminated polydimethylsiloxanes. Other additives, such as fluxing agents, may also be added as needed. The kinds and amounts of elastomers and fluxing agents that may be used are known to those skilled in the art.

In general, the underfill material may be cured within a temperature range of from about 130° C. to about 170° C. and within about 5 minutes to about 4 hours. The time and temperature curing profile for each underfill material, however, may vary.

The underfill material may be prepared, for example, by simultaneously or separately agitating, dissolving, mixing and dispersing the epoxy resin, and curing agent, and optionally catalysts, elastomers, coupling agents, fillers, fluxing agents and/or flow and adhesion agents. The device for mixing, agitating, and dispersing is not critical although, an attritor, three-roll mill, ball mill or planetary mixer each equipped with agitating and heating means may generally be used. A suitable combination of these devices may also be useful.

The curable underfill material composition containing low molecular weight anhydride polymers and/or oligomers may be applied using a standard capillary flow process or assisted flow process. The underfill material may be used for new lead free under bump metallurgy (i.e., SnAgCu, SnAg, SnCu) and may be applied with other newer processes such as no-flow underfills, which, if properly formulated, may significantly decrease manufacturing cost by eliminating the fluxing process, the underfill flow process, and the underfill cure process. According to an embodiment of the present invention, such material may be used with lead-free solder materials or with an instant chip joining process.

EXAMPLES

Examples of the invention are given below by way of illustration and not by way of limitation.

Example 1

Styrene/maleic anhydride copolymer (2 wt %) of a molecular weight of about 1600 g/mole and the catalyst imidazole (1 wt %) were added to bis F resin (4 grams). Scheme 6 shows the structure of the composition. The resin was heated to about 70° C. and mixed thoroughly until all of the polymer was observed to dissolve in the epoxy resin, thereby forming a homogeneous solution. The solution was cooled to room temperature and cured at about 165° C. for about 2 hours. A cross-linked hard transparent polymer was obtained.

Example 2

Styrene/maleic anhydride copolymer (5 wt %) of a molecular weight of about 1600 g/mole and the catalyst imidazole (1 wt %) were added to bis F resin (4 grams). Using the same process as described in Example 1, a cross-linked hard transparent polymer was obtained.

Example 3

Styrene/maleic anhydride copolymer (7.5 wt %) of a molecular weight of about 1600 g/mole and the catalyst imidazole (1 wt %) were added to bis F resin (4 grams). Using the same process as described in Example 1, a cross-linked hard transparent polymer was obtained.

Example 4

Styrene/maleic anhydride copolymer (10 wt %) of a molecular weight of about 1600 g/mole and the catalyst imidazole (1 wt %) were added to bis F resin (4 grams). Using the same process as described in Example 1, a cross-linked hard transparent polymer was obtained. By DMA (Dynamic Mechanical Analysis), the $T_g$ of the polymer was found to be 55° C. Using TMA (Thermal Mechanical Analysis) measurements, the coefficient of thermal expansion of the polymeric system was found to be 63 ppm/° C.

Example 5

Styrene/maleic anhydride copolymer (25 wt %) of a molecular weight of about 1600 g/mole and the catalyst imidazole (1 wt %) were added to bis F resin (4 grams). Using the same process as described in Example 1, a cross-linked hard transparent polymer was obtained. By DMA, the $T_g$ of the polymer was found to be 75° C. Using TMA measurements, the coefficient of thermal expansion of the polymeric system was found to be 57 ppm/° C.

Example 6

To determine the percent weight during cure, the following experiment was conducted.

Styrene/maleic anhydride copolymer (10 wt %) of a molecular weight of about 1600 g/mole and the catalyst imidazole (1 wt %) were added to bis F resin (4.0 grams). The resin was mixed thoroughly to form a homogeneous solution. A small amount of the resin was heated from about 25° C. to about 165° C. and held for 2 hours using thermogravimetric analysis. Weight loss during cure was measured to be 1 wt %.

A similar experiment was conducted with a monomeric anhydride sample. Cyclohexyl anhydride copolymer (1.18 grams) and the catalyst imidazole (1 wt %) were added to bis F resin (2.0 grams). Weight loss during cure was measured to be 3.6 wt %.

Example 7

Cyclic olefin (10 wt %) containing various functional groups (e.g., epoxies, esters, ethers, alcohols, anhydrides, nitriles)/maleic copolymer of a molecular weight<5000 g/mole and the catalyst imidazole (1% wt) are added to epoxy resin (4 grams) such as bis F, napthelene, and the like. The resin is heated to about 70° C. and mixed thoroughly until all of the polymer is observed to form a homogeneous solution. The solution is cooled to room temperature and cured at about 165° C. for about 2 hours. A cross-linked hard hazy polymer is obtained.

Example 8

Use of Polymeric Anhydride Formulation as Underfill Material

The product in example 4 was evaluated as an underfill on a flip chip package. The product was dispensed on one side of a die of a flip chip package that had been pre-baked. The substrate was held at about 70° C. for about 1 minute for the underfill to flow through the gap between the die and the substrate. After 1 minute, the package was removed and wet CSAM (C-mode Scanning Acoustic Microscopy) was conducted to confirm full coverage of the underfill and also to confirm absence of any voids. The unit was later cured at about 165° C. for about 2 hours, thereby curing the underfill material. The fillet (underfill around the die) was confirmed to be completely cured. CSAM of the package post cure was also observed to be clean with no voiding or delamination as shown below.

Although embodiments are specifically illustrated and described herein, it is to be appreciated that modifications and variations of the present invention are covered by the above teachings and are within the purview of the appended claims, without departing from the spirit and intended scope of the invention.

What is claimed is:

1. An underfill composition comprising:
   a resin; and
   a curing agent selected from the group consisting of maleic anhydride polymers, maleic anhydride oligomers, maleic anhydride copolymers and mixtures thereof, having the formula:

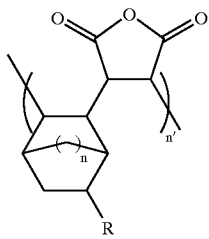

in which R is selected from the group consisting of alkyl, aryl, substituted aryls, esters, ethers, lactones, anhydrides, alcohols, nitriles, epoxy, and mixtures thereof.

2. The composition according to claim 1 wherein the curing agent is an olefin/maleic anhydride.

3. The composition according to claim 2 wherein the olefin/maleic anhydride is selected from the group consisting of styrene/maleic anhydride, cyclohexane/maleic anhydride, and norbornene/maleic anhydride.

4. The composition according to claim 1 further comprising at least one component selected from the group consisting of catalyst, elastomer, coupling agent, filler, fluxing agent, flow agent, adhesion agent, and mixtures thereof.

5. The composition according to claim 4 wherein the catalyst is selected from the group consisting of imidazoles, phosphines, dicyanamide, and substituted dicyamide compounds.

6. The composition according to claim 4 wherein the curing agent is in an amount of from about 5 to about 25 weight percent based on total weight of the resin and the catalyst.

7. An underfill material that is a cured epoxy resin composition comprising:
   one of a liquid and semisolid epoxy resin; and
   a curing agent selected from the group consisting of maleic anhydride polymers, maleic anhydride oligomers, maleic anhydride copolymers and mixtures thereof, having the formula:

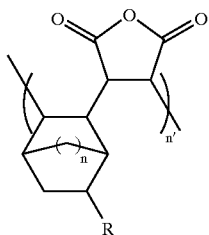

in which R is selected from the group consisting of alkyl, aryl, substituted aryls, esters, ethers, lactones, anhydrides, alcohols, nitriles, epoxy, and mixtures thereof.

8. The composition according to claim 7 wherein the curing agent is an olefin/maleic anhydride.

9. The composition according to claim 8 wherein the olefin/maleic anhydride is selected from the group consisting of styrene/maleic anhydride, cyclohexane/maleic anhydride, and norbornene/maleic anhydride.

10. The composition according to claim further comprising at least one component selected from the group consisting of catalyst, elastomer, coupling agent, filler, fluxing agent, flow agent, adhesion agent, and mixtures thereof.

11. The composition according to claim 10 wherein the catalyst is selected from the group consisting of imidazoles, phosphines, dicyanamide, and substituted dicyamide compounds.

12. The composition according to claim 10 wherein the curing agent is in an amount of from about 5 to about 25 weight percent based on total weight of the resin and the catalyst.

13. A device comprising:
    a substrate;
    an electrical component; and
    an underfill composition between the electrical component and the substrate,
    the underfill composition including
    a resin; and
    a curing agent selected from the group consisting of maleic anhydride polymers, maleic anhydride oligomers, maleic anhydride copolymers and mixtures thereof, having the formula:

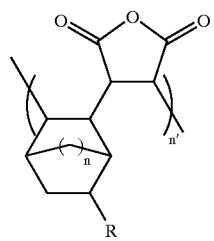

in which R is selected from the group consisting of alkyl, aryl, substituted aryls, esters, ethers, lactones, anhydrides, alcohols, nitriles, epoxy, and mixtures thereof.

14. The device according to claim 13 wherein the curing agent is an olefin/maleic anhydride.

15. The device according to claim 14 wherein the olefin/maleic anhydride is selected from the group consisting of styrene/maleic anhydride, cyclohexane/maleic anhydride, and norbornene/maleic anhydride.

16. The device according to claim 13 further comprising at least one component selected from the group consisting of catalyst, elastomer, coupling agent, filler, fluxing agent, flow agent, adhesion agent, and mixtures thereof.

17. The device according to claim 16 wherein the catalyst is selected from the group consisting of imidazoles, phosphines, dicyanamide, and substituted dicyamide compounds.

18. The device according to claim 16 wherein the curing agent is in an amount of from about 5 to about 25 weight percent based on total weight of the resin and the catalyst.

* * * * *